United States Patent [19]
Almasy

[11] Patent Number: 5,073,937
[45] Date of Patent: Dec. 17, 1991

[54] HYDRODYNAMICALLY PRESSURE REGULATED LOUDSPEAKER SYSTEMS

[76] Inventor: Lee W. Almasy, 339 Long Rd., Pittsburgh, Pa. 15235

[21] Appl. No.: 507,638

[22] Filed: Apr. 11, 1990

[51] Int. Cl.[5] ........................ H04R 25/00; H05K 5/00

[52] U.S. Cl. .................................... 381/188; 381/165; 181/148; 181/151

[58] Field of Search .................................... 381/88-90, 381/188, 205; 181/148, 151, 212, 224, 165

[56] References Cited

U.S. PATENT DOCUMENTS 4,004,094 1/1977 Ott ........................................ 181/151
4,210,778 6/1980 Sakurai et al. ...................... 381/188
4,657,108 4/1987 Ward .................................... 181/151

*Primary Examiner*—Leo H. Boudreau
*Assistant Examiner*—Steven P. Fallon

[57] ABSTRACT

The invention is a low frequency ported loudspeaker system comprising a hollow rectangular enclosure, the enclosure having a woofer driver airtight mounted to an aperature of the enclosure, changes in air pressure of the invention's enclosure's interior air mass are reduced by the coaction of a liquid mass contained within an open-ended manometer type structure, inlet of open-ended manometer type structure being attached to the enclosure and is in pressure conveyance with the invention's interior air mass.

6 Claims, 5 Drawing Sheets

HYDRODYNAMICALLY PRESSURE REGULATED LOUDSPEAKER SYSTEMS

SUMMARY OF THE INVENTION

The invention is an improved low frequency loudspeaker system. The invention provides a means of extending the low frequency range and improves the loudspeaker's performance throughout the low frequency range. The invention is able to accomplish these improvements by utilizing the physical structure of the enclosure which includes the utilization of an open-ended manometer type device. The invention possesses a structure which is relatively easy to construct.

Historically, the function of a low frequency loudspeaker enclosure is to control the compressional energy waves produced by the oscillating diaphragm of an electrical low frequency loudspeaker (i.e. "a woofer" or a low frequency driver). These compressional air waves generated by the front and back surfaces of the low frequency driver's diaphragm are phasically destructive to one another. To prevent these waves from physically meeting, the compressional air waves produced by the back surface of the low frequency driver's diaphragm are collected in an airtight box (i.e. the loudspeaker enclosure). To facilitate the collection of this energy, the low frequency driver is securely mounted in an airtight fashion to an aperature located on the loudspeaker enclosure.

There are basically three design types of low frequency enclosures, the acoustical suspension system, the transmission line system, and the ported system. These three systems treat the compressional air energy within the enclosure differently. It is the common intent of these systems to prevent the phasic destruction of the produced air waves. In the acoustical suspension system there is a force on the low frequency driver's diaphragm caused by the difference in the kinetic energy content of the air inside the enclosure and that of the air exterior to the enclosure.

This force can be qualitatively thought of as an "air spring force". It can be used as a damping force to control speaker excursion. The disadvantages of this force is that it can prevent the lower portion of the low frequency range from being reproduced and can reduce the efficiency of the low frequency driver's performance. The magnitude of the "air spring force" can be reduced or increased by changing the interior volume of the enclosure.

Another performance reducing feature of the "air spring force" is the promotion of excessive loudspeaker diaphragm excursion, causing an increase in distortion. The "air spring force" can act as a controlling force until the internal air pressure within the enclosure builds up, this pressure increase causes an excessive "air spring force" creating excess loudspeaker excursion.

A transmission system is not significantly different from an acoustical suspension system. Its interior enclosure volume contains a labyrinth for channeling the compressional energy produced by the back surface of the low frequency driver's diaphragm. The purpose of the labyrinth is to attenuate this energy and in doing so, achieves a reduction of the interior's "air spring force". The transmission system in reducing the "air spring force" is able to mimic the internal pressure response of a much larger loudspeaker enclosure.

The ported system makes use of its enclosure's interior air compressional energy by creating the "air spring force", and also by creating an oscillating mass of air (i.e. an "air piston") in its port which acts as a passive radiator (i.e. a clone speaker) of low frequency sound. A port is a conduit connecting an enclosure's interior air volume with the air exterior of the enclosure. Ported systems typically require a medium or large size enclosures. Bass waves are relatively large (eg. 11 feet long @100 Hz) and the compressional energy associated with these waves makes designing a ported system for small enclosure a difficult task. The "air spring force" acts on the driver's diaphragm and, in addition, it acts on the air mass residing in the portal volume producing it oscillating piston motion. Should this force be too large, the portal air will cease to act as an oscillating piston and will turn to "wind" which is turbulent and acoustically not valued. To avoid this turbulent portal wind, a designer may select a larger interior air volume.

In the three types of low frequency systems described here, the interior air volume of the enclosure must be considered in the system's design. To change the enclosure's volume is to change its "air spring force" or the change in pressure (change from ambient within the enclosure).

To have the ability to physically simulate the internal pressure response of a larger enclosure using a smaller enclosure may be desirable from a logistical consideration (i.e. taking up less space in the listener's room). In engineering terms, having the ability to simulate the interior air pressure behavior of a larger enclosure using a smaller enclosure provides a means of lowering the system Q for a smaller enclosure.

The invention provides a means for reducing the average change in the air pressure occuring within its interior's air volume and, in doing so, is able to physically simulate the average interior air pressure behavior of a larger enclosure.

It is the ability of the invention to perform this reduction of its changes in its interior air pressure which is the main inventive concept of the invention. The invention, in its ability to physically simulate the average pressure behavior of a larger enclosure volume, is able to extend the operational range of the low frequency range and is able to improve the operational efficiency of the loudspeaker system throughout this range. The invention accomplishes this pressure regulation feature in a manner which will be described in written form referencing the accompanying figures.

The following written description of the invention and the accompanying figures serve to define the invention and its merits. The following is a summary of the accompanying figures;

DETAILED DESCRIPTION OF THE INVENTION

Figure 1:
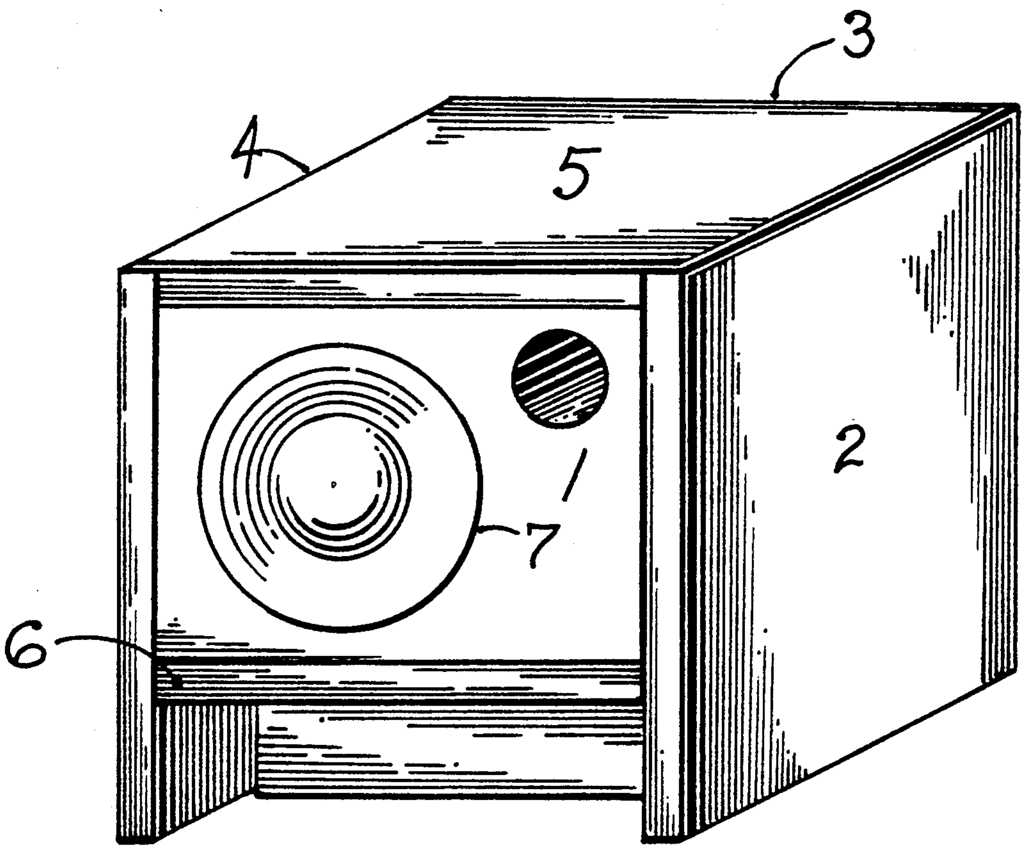
FIG. 1—¾ top front view of the invention.

The structure of the invention is a hollow rectangular enclosure, FIG. 1, comprised of six plane sides, elements 1, 2, 3, 4, 5, 6 of FIG. 1, these sides are to be composed of sheets of a rigid, high density material having uniform thickness, these sides to be joined to one another in a rigid, airtight fashion. The purposes of invention's sides are to confine an air mass within the invention, and to act as a supporting structure.

A low frequency driver is rigidly mounted in an airtight fashion upon the periphery of a primary aperature, element 7 of FIG. 1, the center of the primary aperature, element 7 located on the horizontal center axis of the front side, element 1.

Figure 2:
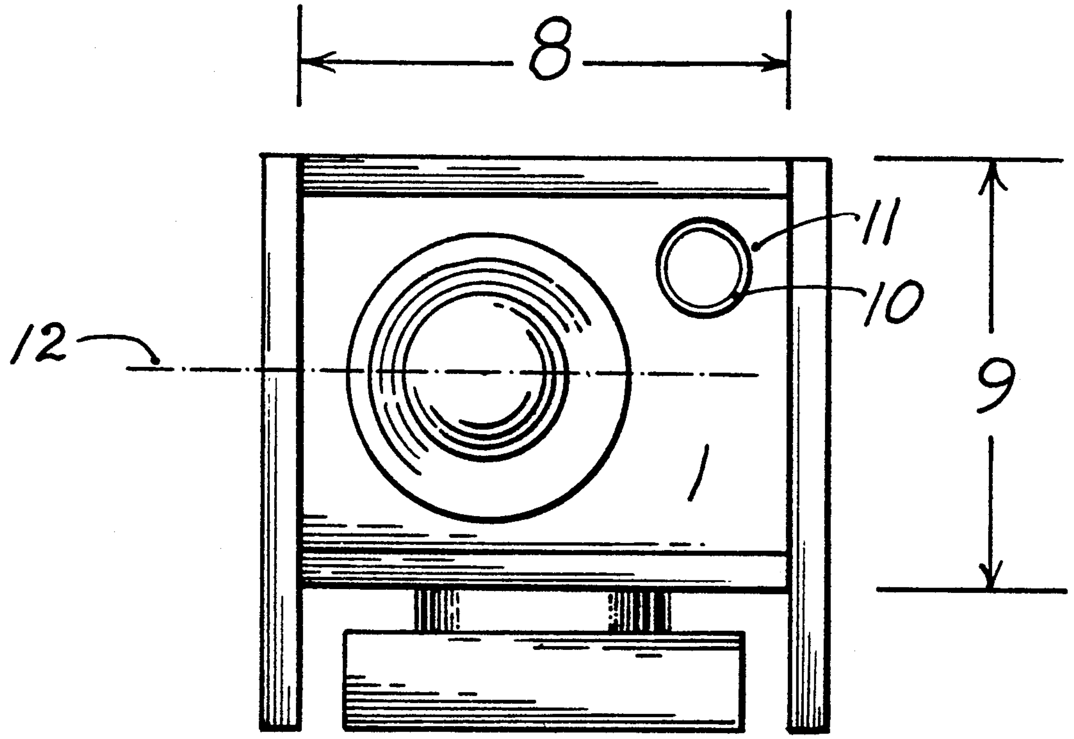
FIG. 2—view of front of the invention.

A rectangular front side, element 1 of FIG. 2, with width, element 8, and heighth, element 9, possessing as a minimum values such as to accommodate the dimensions of the chassis of the low frequency driver and the perpendicular, external flush, airtight mounting of a circular port conduit, element 10, to a second aperature, element 11 of the front side, element 1, the second aperature, element 11, to lie above the center horizontal axis, element 12, of the front side, element 1. The port conduit, element 10, to be dimensionally selected to achieve a pre-selected Helmholtz resonance of the enclosure.

Figure 3:
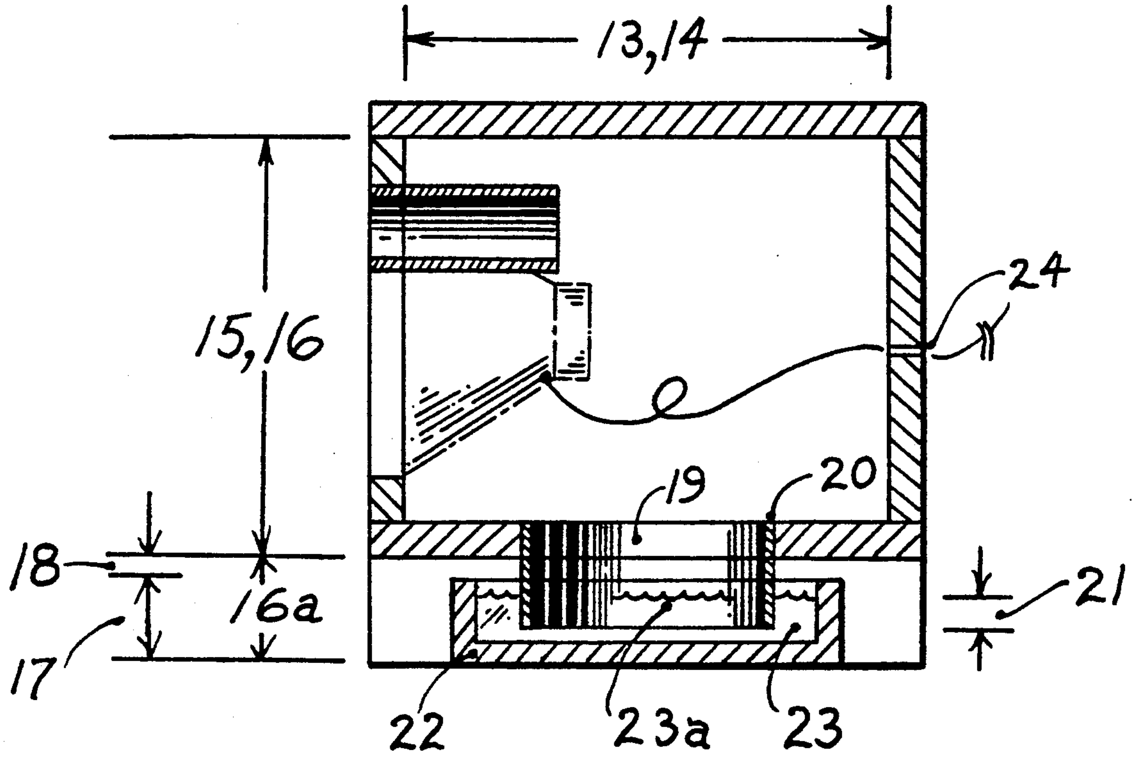
FIG. 3—view of side of the invention.

The back side, element 3 of FIG. 3, possesses the same heighth and width as front side, element 1, and is exactly parallel with the front side, element 1, separated by the width, elements 13 and 14, of the perpendicular lateral sides, elements 2 and 4, these widths, elements 13 and 14 possess, at a minimum, dimensional values equal to the diameter of the loudspeaker driver's chassis. The heighth elements 15 and 16 of lateral sides, elements 2 and 4 possess at a minimum values equal to their respective widths, elements 13 and 14. The lower portion of elements 15 and 16, of the lateral sides, elements 2 and 4, serving to elevate and support the enclosure box a distance, element 16*a*, of sufficient dimension such as the accommodate heighth element 17, plus clearance dimension element 18.

The top side, element 5, perpendicularly intersecting the planes of the front side, element 1, back side, element 3, and lateral sides, elements 2 and 4, element 5 acting as a top boundary for the enclosure, FIG. 1.

The bottom side, element 6, is exactly parallel with top side, element 5, separated by a distance element 15, element 6 is dimensionally equal to the top side, element 5, with the exception that element 6 possesses an aperature, element 19, the area of element 19, to provide an air pressure diffusion area possessing at a minimum a dimensional area equal to the effective loudspeaker diaphragm area located at the geometric center of bottom side, element 6, a waterproof conduit element 20, is perpendicularly extending from the bottom side, element 6, and is rigidly mounted to the periphery of aperature, element 19; in an airtight fashion, the exterior length of the conduit, element 20, to possess at a minimum a value such as to accommodate twice the volumetric displacement, Vd, of the low frequency driver's diaphragm's excursion, the bottom portion, element 21 of element 20, to be immersed in liquid contained within element 22, the liquid, element 23, possessing as a minimum a depth such as to accommodate the volumetric displacement, Vd, of the low frequency driver's diaphragm's excursion, a waterproof cup-type structure element 22 possesses a heighth element 17, element 22 possessing sufficient dimension such as to permit the liquid surface cross sectional area, element 23*a*, (i.e. the liquid surface area existing between the inner dimension of element 22 and the outer dimension of conduit, element 20), to possess at a minimum, an area equal to the area of element 19. The liquid, element 23, filling element 22, is to have a density of 2 gm/cc (+/—gm/cc. The heighth element 17 of element 22 of dimension such as to accommodate at least three times the volumetric displacement, Vd, Vd associated with the maximum linear excursion of the loudspeaker's diaphragm.

An aperature, element 24, on the back side, element 3, element 24 is of sufficient dimension to facilitate the passing of two electrical wires. These wires are used to supply the transmission of electrical power to the low frequency driver's motor. Element 24 is sealed in an airtight fashion about the electrical wires.

The chief merit of the invention is its ability to emulate the change in pressure behavior of the interior air of a larger enclosure's volume. To illustrate how the invention is able to accomplish this, a qualitative analysis of the energy content of the invention possessing a volume V is presented in conjunction with an analysis for a conventional loudspeaker enclosure possessing the same volume V, qualitative comparison's for the maximum interior enclosure pressure are made for both the invention and a conventional low frequency enclosure as follows, (heat flow through the enclosure sides and air leaks in the systems are ignored). The following description refers to FIG. 5. The nomenclature used for the analysis is defined here.

Figure 5:
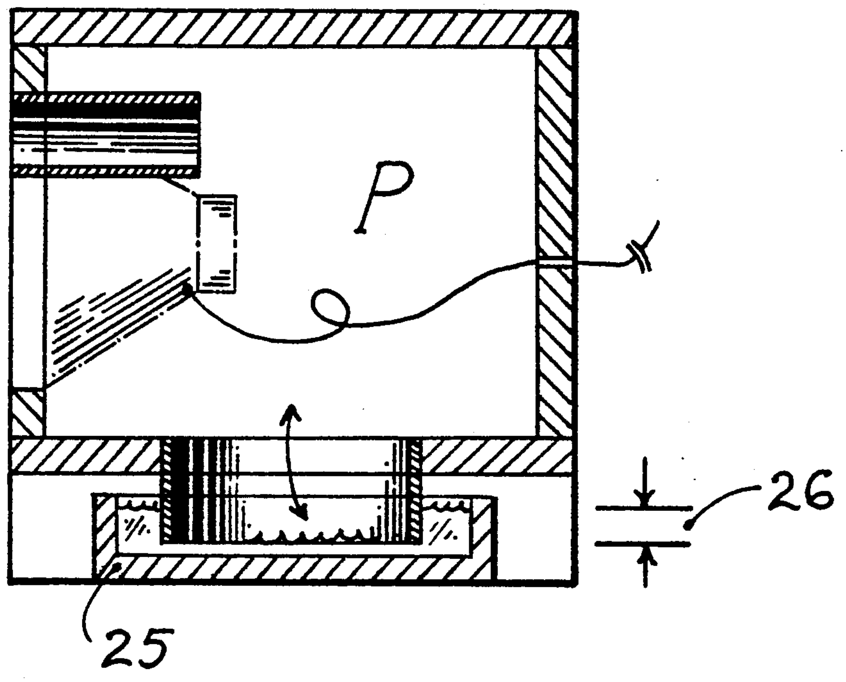
FIG. 5—cut-a-way side view of invention undergoing an increase in its interior air pressure.

| | | |
|---|---|---|
| let: | Eo = | initial, ambient kinetic energy content of the air within a volume V. |
| | (Ef)INV = | final kinetic energy content of the interior air within the invention, of volume V, after energy, Q, has been added to the interior air of the invention. |
| | (Ef)w/o = | final kinetic energy content of the interior air within a conventional loudspeaker's enclosure of volume V, after energy, Q, has been added to the interior air of the conventional loudspeaker's enclosure. |
| | Q = | kinetic energy created by low frequence driver's diaphragm during its air compression excursion. |
| | Pa = | pressure, atmospheric |
| | (Pf)INV = | final average pressure of the interior air of the invention after energy, Q, has been added to the interior air of the invention. |
| | (Pf)w/o = | final average pressure of the interior air of a conventional low frequency loudspeaker's enclosure after energy, Q, has been added to the interior air of the enclosure. |
| | V = | interior air volume of an enclosure, constant. |
| | g = | acceleration of gravity |
| | m = | mass of liquid continued by element 25 of FIG. 5 within the height, h, element 26 of FIG. 5. |
| | h = | height element 26 is the distance between the liquid levels within the invention's structure after the addition of energy, Q. |
| | mc = | moving mass of woofer driver's diaphragm. |
| | v = | velocity of woofer driver's diaphragm. |
| | Eo = | Pa V |
| | (Ef)INV = | Eo + Q |
| | (Ef)INV = | Pa V + Q |

At hydrostatic equilibrium of the fluid column, element 26, 50% of the energy added, Q, is stored in the form of potential energy in the form of a fluid column, element 26, with the remaining 50% of the energy added, Q, being responsible for supplying the incremental kinetic energy to the interior air of the invention, serving to sustain fluid column heighth, h, element 26. The product of (m g h) represents the potential energy of fluid column, element 26, thus Q, the energy added to the invention is responsible for the change in kinetic energy level of the air within the invention and the potential energy of the fluid column, element 26.

$Q=mgh+((Pf)_{INV}-Pa)(V)$, at hydrostatic equilibrium, $mgh=((Pf)INV-Pa)(V)$ now, ps $$(Ef)INV=Pa\ V+Q \quad 1)$$

$$(Ef)INV=Pa\ V+mgh+((Pf)_{INV}-Pa)(V) \quad 2)$$

$$(Ef)INV=Pa\ V+2((Pf)_{INV}-Pa)(V) \quad 3)$$

equating equations 1 and 3, and rearranging, it is shown that for the invention the qualitative pressure change within volume V (change from ambient atmospheric pressure) is;

$$((Pf)INV-Pa)=\tfrac{1}{2}\,(1/V)(Q), \quad 4)$$

Performing an analysis of the qualitative change in pressure (change from atmospheric air pressure) for a conventional low frequency loudspeaker enclosure, of interior air volume, V, with the addition of energy Q is the following:

$$5)\ Eo = Pa\ V$$

$$6)\ (Ef) = Eo + Q$$

$$7)\ (Ef)_{w/o} = Pa\ V + Q$$

The addition of energy, Q, will increase the kinetic energy of the interior air of said conventional low frequency loudspeaker by the amount Q, as follows:

$$Q=[(Pf)_{w/o}-(Pa)]\ (V), \quad 8)$$

substituting the above equation into equation 6, equating equations 6 and 7, and rearranging, the qualitative pressure change (change from ambient atmospheric pressure) for a conventional loudspeaker enclosure is determined to be:

$$[(Pf)_{w/o}-(Pa)]=(1/V)(Q), \quad 9)$$

comparing the above equation with that of the interior air pressure change of that of the invention is the following:

$$[(Pf)_{INV}-Pa]=\tfrac{1}{2}\,(1/V)(Q),\ \text{(the invention)}, \quad 10)$$

$$[(Pf)_{w/o}-Pa]=(1)\,(1/V)(Q),\ \text{(conventional enclosure)}, \quad 11)$$

It is seen from the above qualitative expressions for pressure changes, equations 10 and 11, that the invention possesses the ability to possess an average change in pressure which is half of that of a conventional enclosure. The invention is able to mimic the average change in interior air pressure behavior of a larger conventional enclosure, qualitatively the invention's average interior air pressure will be equal to that of a conventional enclosure possessing twice the interior air volume of that of the invention. This can be qualitatively seen by substituting a value of (2 V) for the V value in equation 11 and then comparing equation 10 with equation 11.

Figure 4:
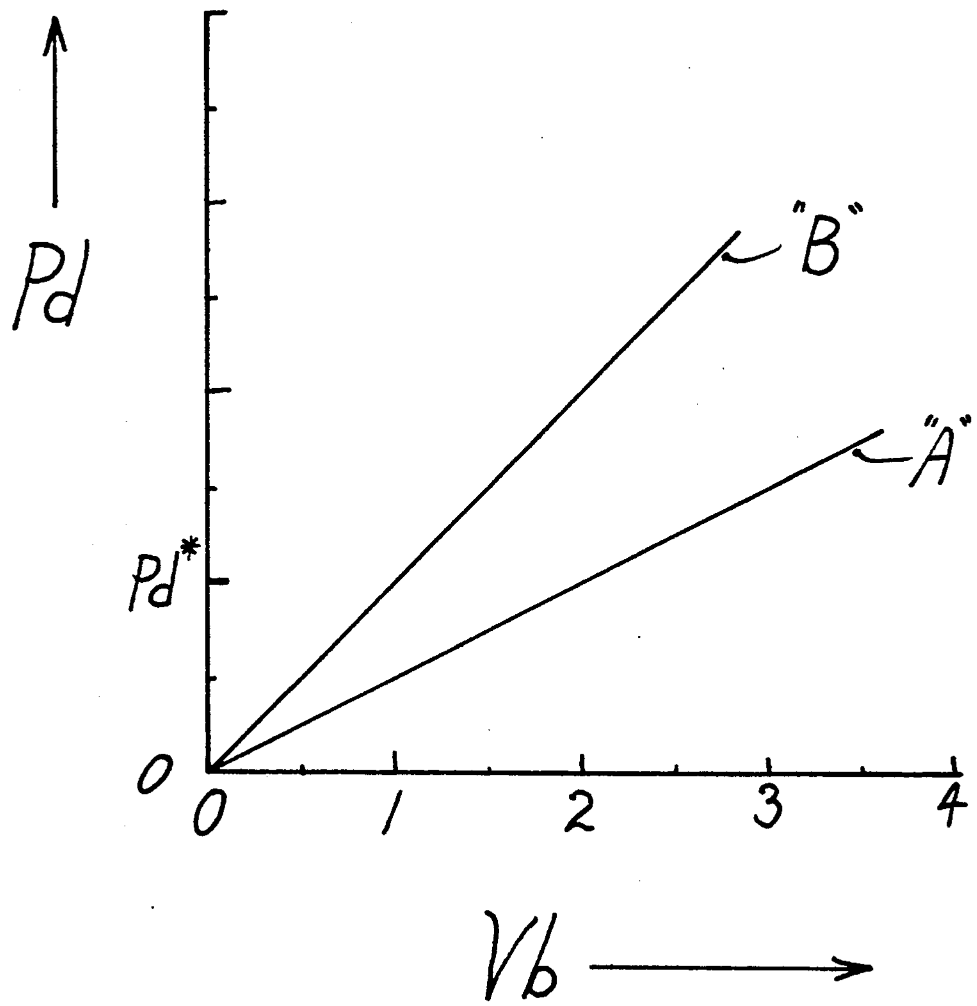
FIG. 4—graph of change in pressure (Pd) versus enclosure volume (Vb) for an enclosure possessing the structure of the invention (curve "A") and for a conventional enclosure structure (curve "B").

Curves "A" and "B" of FIG. 4 qualitatively represent the change in pressure (Pd) versus enclosure volume (Vb).

Referring to FIG. 4, curve "A" represents the pressure response of a loudspeaker enclosure volume, Vb, utilizing invention's structure elements 19, 20, 22, and 23; Curve "B" represents the pressure response of a conventional loudspeaker enclosure volume Vb without the invention's elements 19, 20, 22, and 23.

The slope of curve "B" is twice that of curve "A". Examining these curves "A" and "B" for a particular average pressure change, Pd, shows that curve "A", is able to possess a $P_d$ representative of a larger volume (i.e. a larger conventional enclosure volume). The change in pressure, $P_d$ of FIG. 4, is caused by the volumetric air displacement created by the loudspeaker's diaphragm's movement.

The "air spring force", previously mentioned, is caused by the pressure differential existing between the two surfaces of the loudspeaker's diaphragm. During the operation of a low frequency loudspeaker system an average pressure increase occurs within an enclosure, this pressure change is caused by air displacement created by the loudspeaker's diaphragm's movement.

Examining curves "A" and "B" of FIG. 4 it is seen that for a given pressure change, Pd*, the invention (curve "A") represents a volume of 2 units, the conventional enclosure (curve "B") undergoing the same pressure drop, Pd*, represents a volume of 1 unit. In addition to the individual change in air pressure caused by the movement during an individual cycle of the loudspeaker diaphragm, there is an incremental "build-up" in average interior air pressure caused by the continuous cyclic movement of the loudspeaker diaphragm. This operational incremental "build-up" of pressure within the loudspeaker's enclosure serves to create an incremental increase in the "air spring force" causing excessive loudspeaker diaphragm excursion, this causes distortion in the sound reproduction. The invention's elements 19, 20, 22 and 23 serve to relieve one half of this incremental "build up" pressure within loudspeaker's air volume, thus, in doing so, reduces the incremental increase in the "air spring force", thus reducing excessive loudspeaker excursion (i.e. distortion). The following equation qualitatively illustrates the relationship between the kinetic energy delivered by the movement of the diaphragm of the loudspeaker (i.e. $\tfrac{1}{2}\,mcv^2$) and the associated change in the interior air pressure, (dP), of the loudspeaker enclosure (of volume V).

$$VdP=\tfrac{1}{2}\,mcv^2=Q \quad 12)$$

It is seen from equation (12) that if a finite energy is added, Q, to a closed volume that increasing the volume will result in a decrease in the pressure change and the associated "air spring force". The "air spring force" multipled by a loudspeaker's diaphragm's linear excursion yields the value of the energy opposing the loudspeaker's diaphragm's motion, this opposing compressional air energy serves to impair the efficiency of the loudspeaker system. The elements 19, 20, 22, and 23 serve to reduce changes in the enclosure's interior air pressure and in doing so reduces the opposing energy of the enclosure interior air and improves the operational efficiency of the loudspeaker system. The compressional energy increase can serve to retard the loudspeaker's diaphragm's motion in the lower portion of the low frequency range, a reduction of this compressional energy will lessen the energy opposing the loudspeaker's diaphragm's motion and thus will permit a lowering of the operational limits of the low frequency range, the elements 19, 20, 22, and 23 facilitate a reduction is this compressional energy and hence, extends the lower operating limit of the low frequency range of a low frequency loudspeaker system. It is obvious that various physical configurations of the invention's elements 19, 20, 22, and 23 are possible and the inventive concept represented by the functionality of the invention's elements 19, 20, 22 and 23 (in their ability to reduce the interior air pressure of a loudspeaker enclosure) is the inventive uniqueness of the invention. Elements 19, 20, 22, and 23 have the ability to be used in beneficial conjunction with either a ported, an acoustical suspension or transmission system. The invention uses a ported system in an attempt to utilize a port as passive radiator, making a beneficial use of the enclosure's compressional air. A prototype of the invention was constructed and performed satisfactorily.

The dimensions of the port, element 10, are selected to achieve a specified Helmholtz bass resonance for the low frequency loudspeaker system; at this resonance the compressional air energy of the loudspeaker enclosure's volume is reduced (i.e. it is transformed into the oscillating movement of the air mass residing within the portal volume); this reduction in this energy serves to reduce excessive loudspeaker diaphragm excursion. It has been described, a means of improving the performance of a low frequency loudspeaker system by the usage of the inventive concept of the invention. The invention improves the operational performance efficiency of a low frequency loudspeaker system, the invention extends the extension of the operational low frequency range, and the invention reduces speaker diaphragm excess excursion. The invention here is to serve as a low frequency loudspeaker system when equipped with a woofer driver. The invention, when used in conjunction with higher frequency driver and appropriate electronic frequency cross over provides a broadband frequency loudspeaker system.

This disclosure of the invention described herein represents the preferred embodiment of the invention. It is obvious that those who are skilled in the art can now make numerous designs which are variations of the methodologies and apparatus herein described and the modified application of the invention are possible without departing from the spirit and scope of the appended claims.

I claim:

1. An improved loudspeaker system comprising:

electroacoustical transducing means having a vibratible diaphragm, air chamber means having physical impermeable boundaries forming a hollow air cavity, said air cavity confining an air mass, open-ended manometer type device means providing a waterproof conduit with said conduit to be partially filled with liquid, said conduit to perform the structure functionality of an U-tubed shaped conduit with the outlet end of said conduit to be vented to atmospheric pressure and the inlet end of the said conduit in pressure communication with air mass of the said air chamber means, pressure regulator means controlling the air pressure of a volumetrically confined air mass using open ended manometer-type device structure means to act as a pressure conveyance of the air pressure of the said volumetrically confined air mass with the ambient air pressure, said open-ended manometer type device means to be partially filled with said liquid mass, said liquid mass serving to confine said air mass of said air chamber means, said liquid possessing a density of 2 gm/cc (+/−1.5 gm/cc), said pressure regulation means having open-ended manometer-type device means providing for sufficient vertical movement of said liquid such as to accommodate at least twice the volumetric displacement associated with the maximum linear excursion of the electroacoustical transducing means vibratile diaphragm's maximum excursion distance, said pressure regulation means exhausting the outlet of the open-ended manometer type device means to atmospheric pressure, enclosure means utilization of the vibratile diaphragm as a portion of the boundary of said air chamber means, said enclosure means utilization of the liquid contained within the pressure regulation means, said liquid serving to be a portion of the impermeable boundary of the said air chamber means, said enclosure means providing a rigid rectangular air chamber means supporting the electroacoustical transducing means sealed in an airtight fashion upon the periphery of an aperture on a side of the said air chamber, said electroacoustical transducing means providing for the transformation of incoming electrical energy into air pressure waves, said enclosure means mounting the inlet of pressure regulation means in an airtight fashion about the periphery of an aperature located on a side of said enclosure means, said enclosure means providing a coacting of the air mass residing within the said air chamber means with the said electroacoustical transducing means providing changes in the average pressure level of the said air mass, said pressure regulation means coacting with the air mass of air chamber means, said pressure regulation means reducing changes in average air pressure within the said air chamber means, wherein the effect of the pressure regulation means is a reduction in the change of air pressure within the air chamber thereby allowing the loudspeaker to emulate the air pressure behavior.

said pressure regulation means providing enhanced volume means providing reduction of torsional energy acoustically imparted to structure of enclosure means by the air mass of the said air chamber means, said reduction of said torsional energy reducing the amplitude of the standing waves produced by the structure of the said enclosure means, said pressure regulation means providing for a reduction in compressional air energy of the air mass residing within the said air energy of the air mass residing within the said air chamber means, reduction of said energy to promote a lowering of the lower limit of the loudspeaker's low frequency operational frequency band, reduction of said energy to reduce loudspeaker diaphragm excess excursion, reduction of said energy to promote an increase in the performance efficiency of the electroacoustical transducing means, passive radiator means possessing an acoustical mass, said acoustical mass to residing within a conduit, said conduit mounted perpendicularly to and externally flush with exterior of said enclosure means providing air pressure conveyance of the air mass residing within said enclosure means with the ambient atmospheric air pressure, said passive radiator means tuned to a specified resonance frequency providing for reduction of compressional air energy of the said air chamber means reducing the said energy, said energy causal of loudspeaker diaphragm excess excursion, said excess excursion being reduced by passive radiation means.

2. A loudspeaker system in accordance with claim 1 wherein the inlet area of the pressure regulation means is greater than the effective surface area of a side of the diaphragm of the electroacoustical transducing means.

3. A loudspeaker system in accordance with claim 1 wherein the inlet area of the pressure regulation means is less than the effective surface area of a side of the diaphragm of the electroacoustical transducing means.

4. A loudspeaker system in accordance with claim 1 wherein the inlet area of the pressure regulation means is equal to the effective surface area of a side of the diaphragm of the electroacoustical transducing means.

5. A loudspeaker system in accordance with claim 1 wherein said passive radiating means of a conduit.

6. A loudspeaker system in accordance with claim 1 wherein said passive radiating means is a vibratile diaphragm, said vibratile diaphragm not possessing an electrical motor.

* * * * *